United States Patent [19]
Fieau et al.

[11] Patent Number: 5,168,237
[45] Date of Patent: Dec. 1, 1992

[54] TEST DEVICE FOR A BUS WITH TWO PAIRS OF CONDUCTORS

[75] Inventors: Jean-Claude Fieau, Perros Guirec; Joseph Fort, Louannec, both of France

[73] Assignee: Centre National d'Etudes des Telecommunications, Isdsy-Les-Moulineaux, France

[21] Appl. No.: 599,425

[22] Filed: Oct. 18, 1990

[30] Foreign Application Priority Data

Oct. 26, 1989 [FR] France ............... 89-14040

[51] Int. Cl.$^5$ ............................................. G01R 31/02
[52] U.S. Cl. .................................... 324/542; 324/539
[58] Field of Search ............... 324/539, 541, 542, 66, 324/133; 340/651

[56] References Cited

U.S. PATENT DOCUMENTS 2,964,701 12/1960 Argabright ............... 324/542
4,074,187 2/1978 Miller et al. ............. 324/542

FOREIGN PATENT DOCUMENTS

0652506 3/1979 U.S.S.R. ................ 324/542

Primary Examiner—Jack B. Harvey
Attorney, Agent, or Firm—Jacobson, Price, Holman & Stern

[57] ABSTRACT

The device checks the connection of the conducting wires of a bus such as a bus distributed in a local area network. It comprises two test modules to be connected to the terminations of the bus. The first module comprises a voltage source and detects electric discontinuities in the pairs of wires, and an abnormal crossing of two wires of one and other pair when the second termination is directly connected to terminating impedances of the bus. The second module signals a crossing of wire pairs and crossings of the wires within a pair. These different tests are carried out by working switches and their results are interpreted as a function of the activating and deactivating of current sensors such as LED.

9 Claims, 7 Drawing Sheets

TEST DEVICE FOR A BUS WITH TWO PAIRS OF CONDUCTORS

BACKGROUND OF THE INVENTION

The present invention relates to a device for testing a bus comprising at least two distinctive Pairs of conducting wires running parallel to one another between two terminations having our terminals each and in a given order.

When the bus is a transmission bus where the pairs are allocated to respective opposite transmission directions of signals, each wire of a pair has a polarity that is clearly distinctive to that of the other wire of the same pair. Whence the need to ensure when laying the conducting wires that the ends of each of the wires are properly connected to the corresponding terminals marked on the two end terminations of the bus. Though wires frequently get crossed and pairs frequently get permuted, an anomaly that occurs much more frequently consists in a breakage of electric continuity in the pairs of conductors. This breakage of electric continuity is caused either by faulty resistance coupling especially at one of the bus ends between the two wires of a pair, or by micro-breakage of a wire between the two bus ends.

OBJECTS OF THE INVENTION

The main object of this invention is to provide a device for quickly testing a bus with four conducting wires, mainly in order to detect electric continuity faults in the bus, as well as wiring faults in the bus. Another object of this invention is to provide a bus test device including simple and inexpensive electronic components.

SUMMARY OF THE INVENTION

Accordingly, in a device for testing a bus, the bus therein comprises
- first, second, third and fourth parallel conducting wires,
- a first termination having first, second, third and fourth terminals normally connected to first ends of the first, second, third and fourth conducting wires
- a first termination having first, second, third and fourth terminals normally connected to second ends of the first, second, third and fourth conducting wires respectively, and
- first and second terminating impedances respectively connectable to first and second terminals of the second termination and to the third and fourth terminals of the second termination.

The bus test device comprises
- a dc voltage source,
- a first switch connectable to the first and second terminals of the first termination,
- a second switch connected in series to the voltage source and the first switch, and connectable to the third and fourth terminals of the first termination,
- a first current sensing means forward-biased by the voltage source and interconnected in series between the voltage source and said switches, and
- a second current sensing means forward-biased by the voltage source and interconnected in series between the first and second switches.

The first and second current sensing means are activated when there is no electric discontinuity in the first pair of the first and second conducting wires and also in the second pair of the third and fourth conducting wires. If the second current sensing means is deactivated when the first switch is closed, this means that there is an electric discontinuity in the second pair. Reciprocally, if the second current sensing means is deactivated when the second current switch is closed and the first switch is open, this means that there is an electric discontinuity in the first pair of conductors.

According to another feature of the invention, the test device comprises a third current sensing means which is connected in antiparallel to the second current sensing means. The third current sensing means is used when the bus s comprises an unwanted crossing of one of the wires of the first pair with one of the wires of the second pair.

According to another feature of the invention, the test device comprises fifth and sixth current sensing means connectable in antiparallel between the second and third terminals of the second termination of the bus. The fifth and sixth current sensing means are used to signal a total permutation of the ends of the two conductor pairs at one of the terminations of the bus.

According to yet another feature of the invention, the test device comprises seventh and eighth current sensing means connectable in antiparallel between the first and second terminals of the second termination of the bus, and ninth and tenth current sensing means connectable in antiparallel between the third and fourth terminals of the second termination. These last four current sensing means are used to signal an unwanted permutation of the first and second conducting wires in the first pair and/or an unwanted permutation of the third and fourth conducting wires in the second pair.

BRIEF DESCRIPTION OF THE DRAWINGS

Further features and advantages of the present invention will be apparent more clearly from the reading of the description of several preferred embodiments of the invention as illustrated in the corresponding accompanying drawings in which.

DESCRIPTION OF THE PREFERRED EMBODIMENTS

Figure 1:
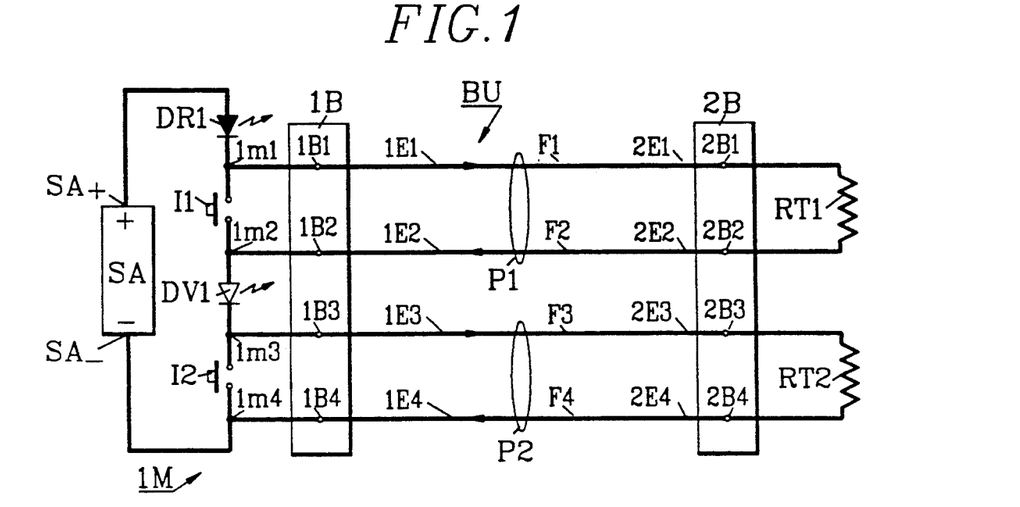
FIG. 1 is an electric diagram of a first module of a test device embodying the invention, connected to a first termination of a bus to be tested shown in a normal configuration.

In reference to FIG. 1, a bus BU to be tested is comprised of two pairs of conducting wires P1 and P2 that run parallel to one another between two terminations 1B and 2B. The connections between the conducting wires of the bus and the terminals of the terminations are carried out in a predetermined order. At the level of the first termination 1B, first ends 1B1 and 1B2 of the wires F1 and F2 of the first pair P1 and first ends 1S3 and 1S1 of the wires F3 and F4 of the second pair P2 are respectively connected to the terminals 1B1, IB2, lB3 and 1B4 of the termination 1B. At the other end of the bus, second ends 2EI and 2E2 of the conducting wires F1 and F2 of the first pair P1 and second ends 2E3 and 2E4 of the conducting wires F3 and F4 of the second pair P2 are respectively connected to terminals 2B1, 2B2, 2B3 and 2B4 of the second termination 2B.

Such a bus can be several hundred meters or even several kilometres long. As already stated, when installing the bus and when wiring the bus to the terminations, certain anomalies can appear in either at least one conducting wire or at the links connecting the wires to the terminations.

In FIG. 1 the bus is in the normal state and is connected to two terminating impedances. In this instance the impedances are in the form of resistors RT1 and RT2 respectively connected between the terminals 2B1 and 2B2 and between the terminals 2B3 and 2B4 of the second termination 2B.

A test device embodying the invention for conducting wires of bus comprises a first test module 1M also shown in FIG. 1. This first module comprises a dc voltage power source SA having positive SA+ and negative SA- terminals, a first light emitting diode (LED) DRl, a first switch 11, a second light emitting diode DV1 and a second switch I2 that are respectively connected in series between the terminals SA+ and SA−. The diodes DR1 and DR2 are forward-biased in the direction from the terminal SA+ towards the terminal SA− via the switches and are respectively associated with two different colors, e.g.. red (R) and green (V). The module 1M has four terminals 1m1 to 1m4 that are respectively connectable to the terminals 1B1 to 1B4 of the termination IB at the opposited end to the bus BU. The terminals 1m1 and 1m2 are those of the switch Il that are respectively connected to the cathode of the diode DR1 and to the anode of the diode DV1. the terminals 1m3 and 1m1 are those of the switch I2 that are respectively connected to the cathode of the diode DV1 and to the anode of the power source terminal SA−.

The module 1M is intended to detect two types of anomaly in the bus BU, i.e. electric discontinuities in the pairs of conductors P1 and P2 and abnormal crossing between one of the wires of one of the two pairs P1 and P2 and one of the wires of the other pair.

Figure 2:
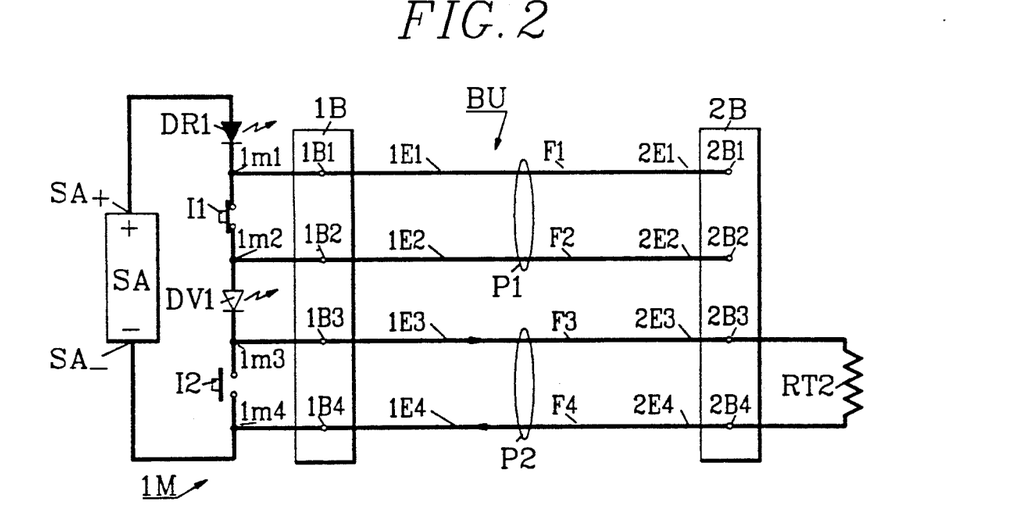
FIG. 2 is a diagram similar to FIG.1, when first and second switches in the first module are respectively closed and open and when there is an electric discontinuity in a first pair of conductors of the bus.

An anomaly of the first type is shown in FIG. 2, i.e. an electric continuity fault in the first pair Pl embodied in this instance by an absence of the terminating resistor RTI, even though such an anomaly can be a cut in at least one of the wires Fl and F2, or a disconnection of one of the terminals of the resistor RTI on the termination 2B. when connecting by plugging the module 1M into the termination 1B, if the diodes DRI and Dv1 light up, the bus does not have an electric continuity fault. If however the diodes DR1 and Dv1 light up during the aforesaid plugging in, this means that there is a fault in the electric continuity in at least one of the conducting wire pairs P1 and P2.

As the switches Il and I2 are in the permanent open position when plugged in, as shown in FIG. 1, if the first switch Il is closed to short-circuit the pair P1, as shown in FIG. 2, there can be two possible cases. If the diodes DR1 and DV1 are again lit up, this means that the first pair Pl has an electric continuity fault such as an absence of the resistor RT1 or bad connection of the latter to the termination 2B. If the diodes DR1 and DV1 remain unlighted, this leads to the supposition that there is an electric continuity fault in the second pair P2, and possibly an electric continuity fault in the first pair P1.

In the latter instance, the test is continued; the switch Il is then released to the open position and the switch I2 is closed to short-circuit the pair P2. If the diodes DR1 and Dv1 light up, there is no electric continuity fault in the first pair Pl, but there is such a fault in the second pair P2. If on the other hand the diodes DR1 and Dv1 do not light up when the second switch I2 is closed, this indicates continuity faults in the two pairs P1 and P2.

In a second embodiment of the first module 1M a second red diode DR2 is connected in antiparallel to the diode DV1, i.e. diodes DR2 and DvI are oppositely poled, thereby signalling crossings between wires of the pairs, as shown in FIGS. 3 to 6.

It should be noted that activation of the first diode DR1 indicates electric continuity in the two pairs P1 and P2 of the bus BU irrespective of the inversion of wires between pairs, as will be seen hereinunder. According to another embodiment, the diode DRI can thus be inserted between the terminal 1m4 of the switch I2 and the power supply terminal sA−.

Figure 3:
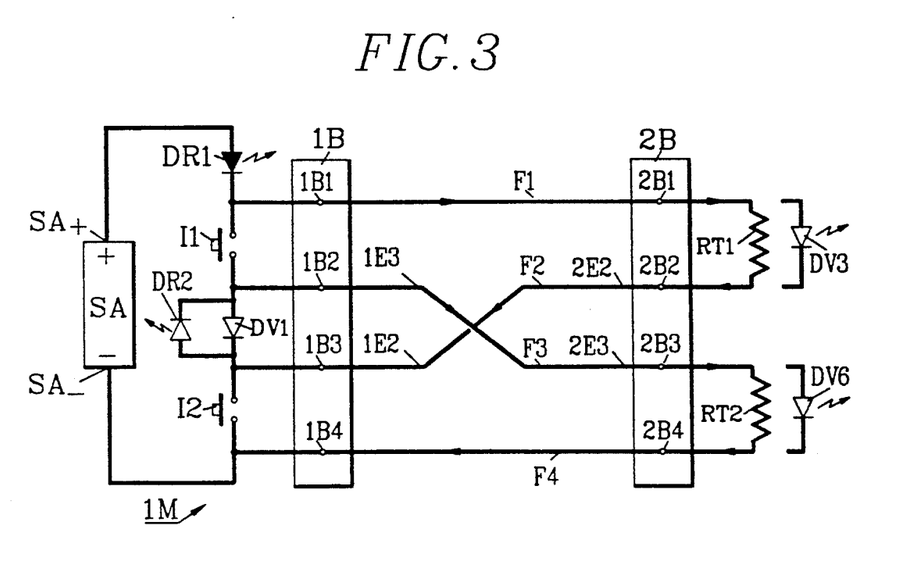
FIGS. 3 and 4 are diagrams similar to FIG. 1, when the two switches are open and when two neighboring wires and two distant wires in the two pairs of the bus are crossed, respectively.
Figure 4:
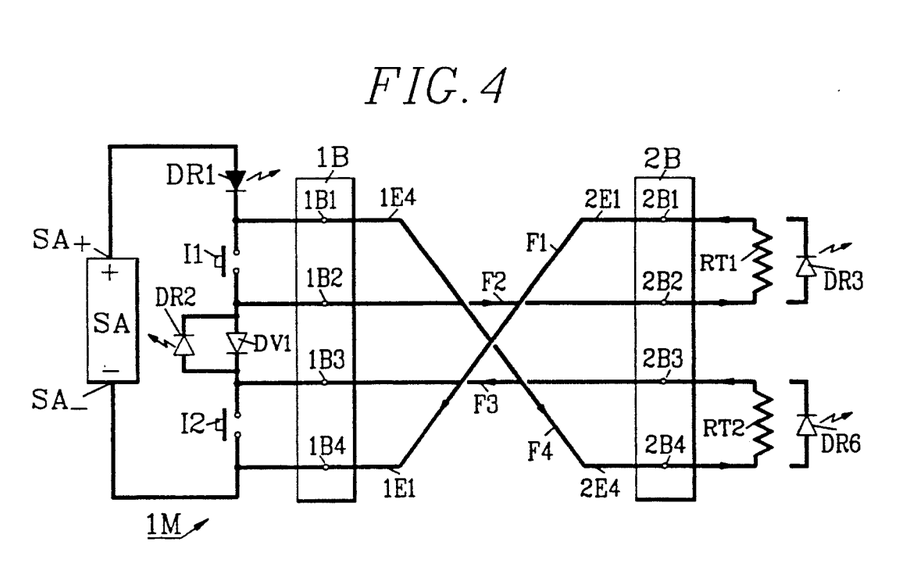

FIGS. 3 and 4 relate to a crossing of "neighbouring" wires F2 and F3 of the pairs Pl and P2 and a crossing of "distant" wires F1 and F4 of the pairs P1 and P2. compared with the normal configuration of the bus BU according to FIG. 1, the first (or second) ends IE2 and lE3 of the wires F2 and F3 in FIG. 3 have been unintentionally crossed and are respectively connected to the terminals IB3 and 1B2 of the first termination 1S and therefore to the terminals of the antiparallel diodes DV1 and DR2. compared with FIG. 1 again, the first (or second) ends 1E1 and lE4 of the wires F1 and F4 in FIG. 4 have been crossed thereby being unintentionally connected to the terminals 1B4 and 1B1 of the first termination 1B respectively. In these two configurations of wire crossings, when the first module IM is connected to the first termination 1B, the switches Il and I2 remaining open, the diode DR1 lights up to signal the electric continuity in the two pairs and more generally in the bus BU, and the diode DR2 also lights up. According to FIG. 3, the current flows through the wire F1, the resistor RT1, the wire F2, the diode DR2, the wire F3, the resistor RT2 and the wire F4; according to FIG. 4, the current flows through the wire F4, the resistor RT2, the wire F3, the diode DR2, the wire F2, the resistor RT1 and the wire F1.

Figure 5:
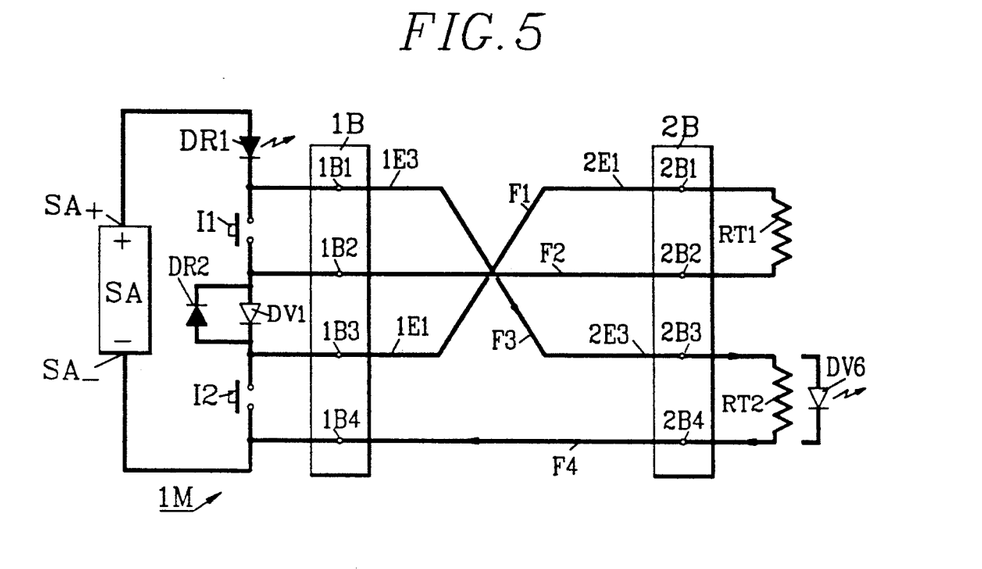
FIGS. 5 and 6 are diagrams similar to FIG. 1, when the switches are open and when first and third wires of the bus and second and fourth wires of the bus are unintentionally crossed, respectively.
Figure 6:
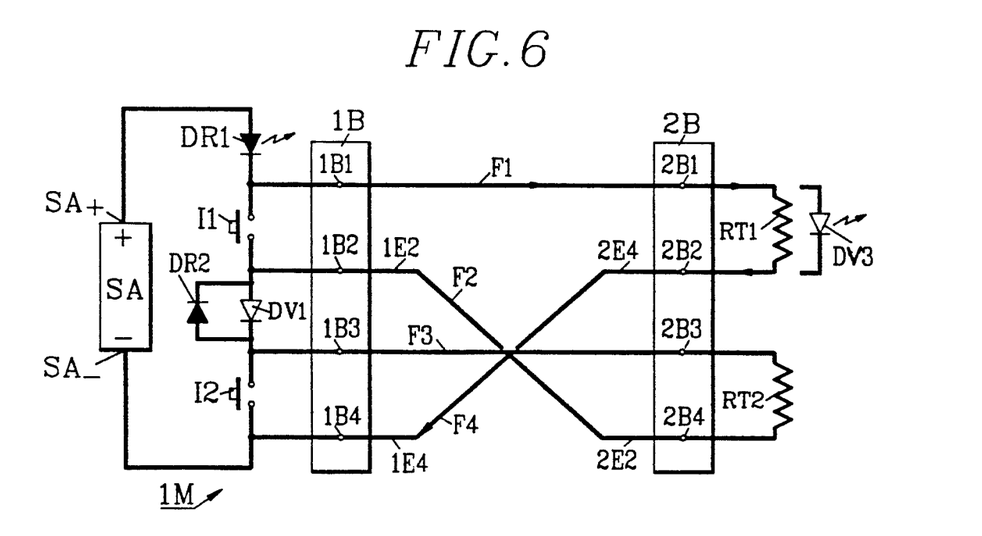

If only the first diode DR1 lights up when the module 1M is plugged into the termination 1B1, this means that the wiring of the bus BU is as per one of the configurations shown in FIGS. 5 and 6.

According to FIG. 5, the first (or second) ends 1E1 and 1E3 of the wires F1 and F3 of the pairs P1 and P2 have been unintentionally crossed, thereby connecting them to the terminals 1B3 and 1B1 of the termination 1B respectively. Under these conditions, the current flows from the terminal SA+ through the diode DR1, the wire F3, the resistor RT2 and the wire F4. The loop formed by the wire F1, the resistor RT1, the wire F2 and the antiparallel diodes DV1 and DR2 is completely disconnected from the power source SA.

Accordingly to FIG. 6, the second (or first) ends 2E2 and 2E4 of the wires F2 and F4 in the pairs P1 and P2 have been unintentionally crossed, thereby connecting them to the terminals 2B4 and 2B2 of the second termination 2B respectively. Under these conditions, the current flows from the power supply terminal SA+ through the diode DR1, the wire F1, the resistor RT1 and the wire F4. The wire F2, the resistor RT2, the wire F3 and the antiparallel diodes DV1 and DR2 are connected in a loop that is completely disconnected from the power source SA.

In order to distinguish more clearly between the signallings of electric discontinuity and of the crossing of wires between pairs, the diodes DV1 and DR2 can have different colors, e.g. green and blue.

The distinction between wiring errors of the conducting wires according to FIGS. 3 and 4 on the one hand, and according to FIGS. 5 and 6 on the other hand, is made by replacing the terminal resistors RT1 and RT2 by pairs of antiparallel light emitting diodes DV3-DV3 and DV6-DR6. In each of these pairs the diodes are preferably in different colors. The diode DV3 is forward-biased from the terminal 2B1 to the terminal 2B2 and is connected in antiparallel to the diode DR3. The diode DV6 is forward-biased from the terminal 2B3 to the terminal 2B4 and is connected in antiparallel to the diode DR6. The wiring anomalies according to FIGS. 3 and 4 corresponding to the diode DR2 lit up are respectively distinguished from one another by only the diodes DV3 and DV6 lighting up and by only the diodes DR6 and DR3 lighting up near the second termination 2B. the wiring anomalies according to FIGS. 5 and 6 corresponding to the diode DR2 unlighted are respectively distinguished by the diode DV6 lighting alone and by the diode DV3 lighting alone near the second termination 2B. According to other embodiments of the test for wire crossings between pairs, the diodes DV3 and DV6 can be connected in series or parallel with the respective resistors RT1 and RT2, or can be included in a second module 2M described hereunder and of which he sole switch I3 is in the open position.

Figure 7:
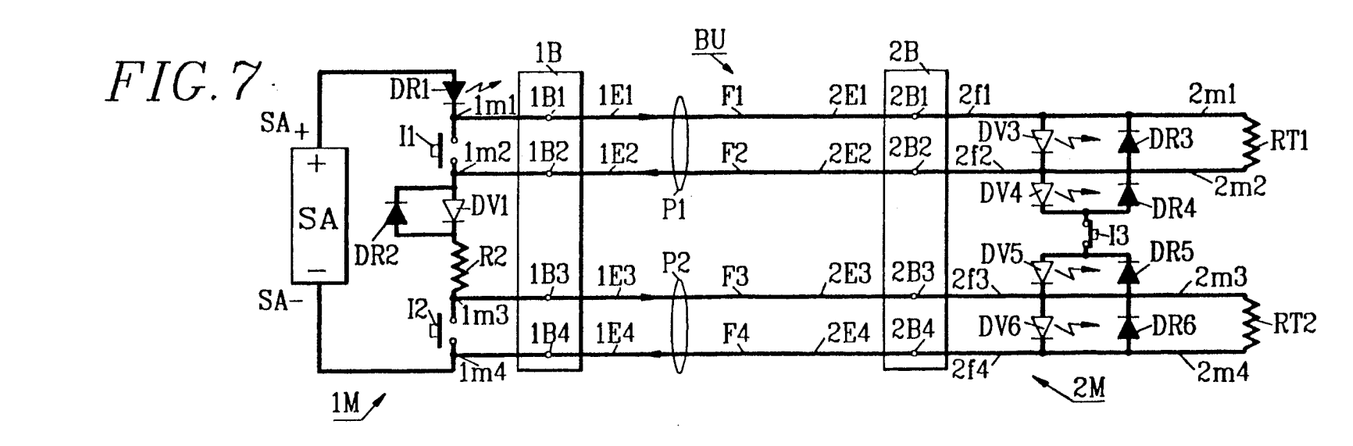
FIG. 7 is a wiring diagram showing a complete test device comprising a first module connected according to FIG. 1, and a second module connected to a second termination of the bus.

In reference now to FIG. 7 which includes the normal configuration of the bus BU according to FIG. 1, the test device also comprises a second passive module 2M that is interconnected between the second termination 2B ad the terminal resistors RT1 and RT2.

The module 2M has two assemblies of four terminals. A first assembly of terminals 2F1, 2f2, 2f3 and 2f4 of the module 2M can be connected by plugging into the terminals 2B1 to 2B4 of the termination 2B. In a second four-terminal assembly of the module 2M, two terminals 2m1 and 2m2 are connected by the terminating resistor RT1, and the two other terminals 2m3 and 2m4 are connected by the terminating resistor RT2. The first terminals 2f1 to 2f4 are connected electrically two-by-two to the second terminals 2m1 to 2m4 in the termination 2B respectively.

The module 2M comprises a first set of four light emitting diodes DV3, DV4, DV5 and DV6 and a switch I3. The diode DV3 has an anode connected to the terminals 2f1 and 2m1 and a cathode connected to the terminals 2f2 and 2m2. The diode DV4, the switch I3 and the diode DV5 are connected in series between the connected terminals 2f2 and 2m2 and the connected terminals 2f3 and 2m3. The anode of the diode DV4 is connected to the terminals 2f2 and 2m2 and the cathode of this diode is connected to a terminal of the switch I3. The anode of the diode DV5 is connected to the other terminal of the switch I3, and the cathode of this diode is connected to the terminals 2f3 and 2m3. The last diode DV6 has an anode connected to the terminals 2f3 and 2m3 and a cathode connected to the connected terminals 2f4 and 2m4. The diodes DV4 and DV5 can be replaced by a single LED diode.

The module 2M also comprises four other light emitting diodes DR3 to DR6 which are respectively connected in antiparallel with the diodes DV3 to Dv6.

After having remarked that the diodes DR1 and DV1 were lighting and that the diode DR2 was unlighted when plugging the first module iM into the termination 1B, according to FIG. 1 or 7, the tests are continued by interconnecting the module 2M according to the configuration shown in FIG. 7. In this configuration in which the bus BU is normal, the other diodes DVJ to DV6 in the second module 2M can be seen to be lighting when the switch I3 is closed and when the bus does not have any anomaly. The diodes Dv3 to Dv6 are preferably associated with a same color green in this instance, which is different from the color of the diodes DR3 to DR6, red in this instance. The module 2M is therefore highly illuminated in green. The diodes Dv3 to Dv6 in the module 2M are forward-biased, and in particular the diodes Dv3 and DV6 "short-circuit" the resistors RT1 and RT2, and the diodes DV4 and DVS "short-circuit" the diodes DV1 and DR2 in the first module.

In order to distinguish between the illumination of module 2M and that of module 1M, though in practice they are usually distant from one another, a resistor R2 is preferably connected in series with the combination of antiparallel diodes DVI and DR2 in the first module IM, between the terminals 1m2 and 1m3, as shown in FIG. 7, so as to decrease the current flowing through the wires F2 and F3 compared with that flowing through the diode DV4, the switch I3 and the diode DV5, similarly to the very low current flowing through the terminating resistors RTI and T2 compared with the higher current flowing through the diodes DV3 and DV6. The red of the diode DRI is predominant, while the second module M is in green.

Figure 8:
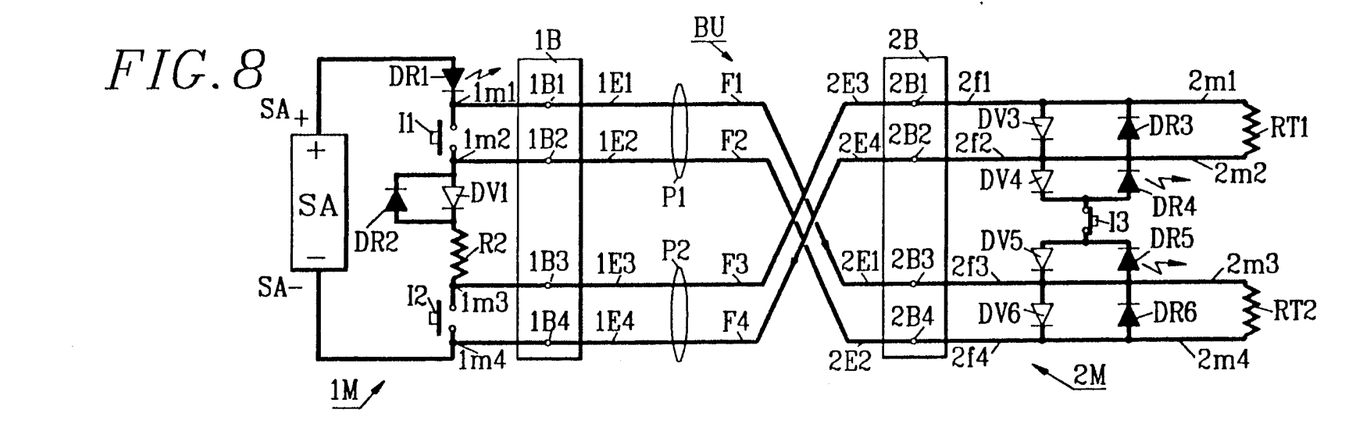
FIG. 8 is an electric diagram similar to that of FIG. 7, when the pairs of conducting wires of the bus are unintentionally crossed.

If, when the switch I3 is closed, the luminescence of the diodes DR4 and DR5 is predominant in the second module 2M, this indicates that the pairs of conducting wires Pl and P2 have been crossed, as shown in FIG. 8. In this figure, it has been supposed that the second (or first) ends 2EI and 2E2 of the wires F1 and F2 of the first pair Pl have been unintentionally connected to the terminals 2f3 and 2f4 of the second module 2M via the termination terminals 2B3 and 2S4, and that the second ends 2B3 and 2S4 of the wires F3 and F4 of the second pair P2 have been unintentionally connected to the terminals 2f1 and 2f2 of the second module 2M via the termination terminals 2S1 and 2s2. The current flows from the wire F1 to the wire F4 mainly via the series combination of the diode DR5, the switch I3 and the diode DR4, since the loop formed by the terminating resistor RT2, the wire F2, the diode DVI, the resistor R2, the wire F3 and the terminating resistor RT1 has a higher resistance. The very low current flowing through the diodes DV6, Dv1 and Dv3 only activates the former very weakly compared to the very strong illumination given off by the diodes DR4 and DR5. Under these conditions, the second module 2M is distinctly illuminated in red, like the first module IM.

Figure 9:
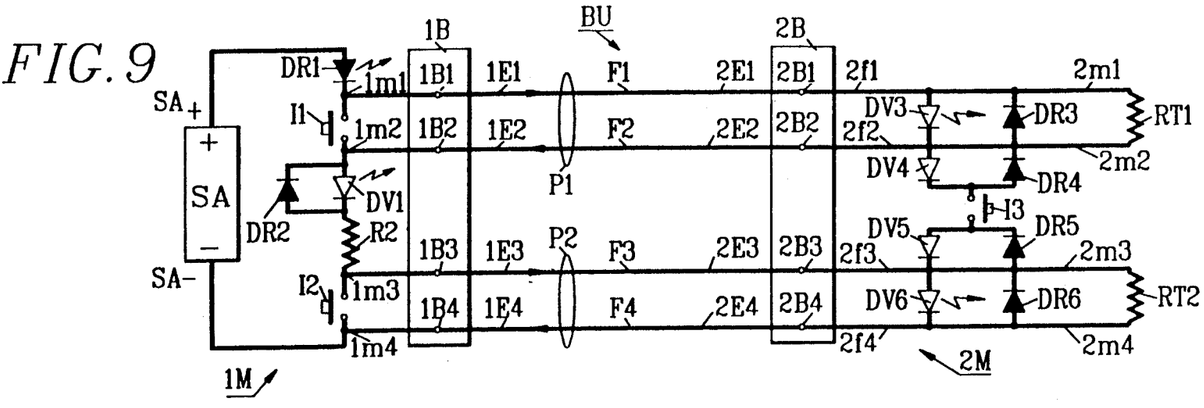
FIG. 9 is an electric diagram similar to that of FIG. 7, when the switch in the second module is open.

In reference to FIG. 9, which is similar to FIG. 7, the switch I3 in the module 2M is however in the open position. The module 2M is also illuminated in green single the majority of the power supply current flows through the forward-biased diodes DV3 and DV6. The diode couples DV4 and DR4 and DVS and DRS are disconnected by the open switch I3.

Figure 10:
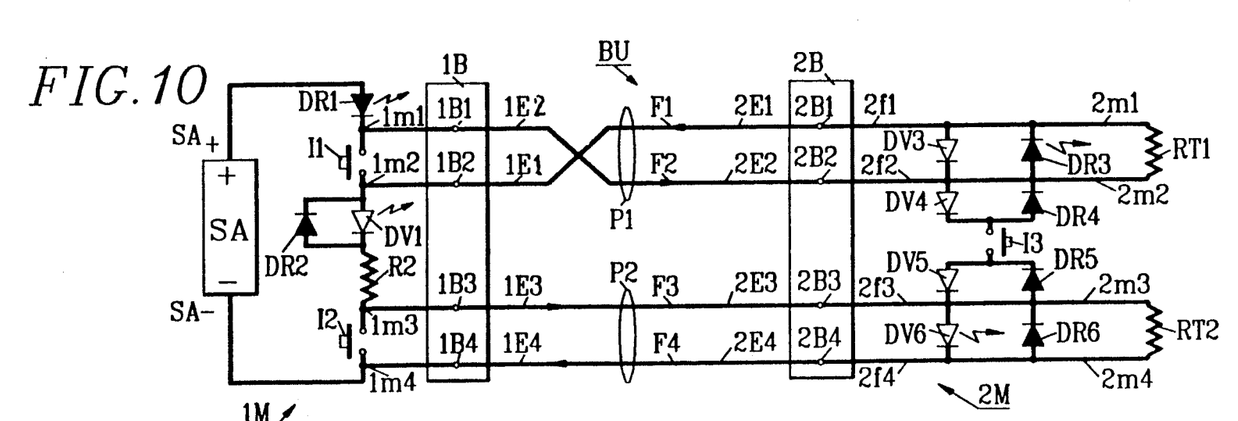
FIG. 10 is an electric diagram similar to that of FIG. 9, when the two wires of the first pair of the bus are unintentionally crossed.

When only one of the diodes DV3 and Dv6 is not lighting and when the antiparallel-connected diode DR3, DR6 is in the opposite state to that of the respective diode DV3. DV6 this means that the bus has a crossing of wires in one of the pairs P1 and P2. This case is illustrated in FIG. 10 in which it has been supposed that the first (or second) ends IE1 and IE2 of the wires F1 and F2 of the first (or second) pair Pl have been unintentionally crossed and respectively connected to the terminals 1BI and IB2 of the first termination 1B. In this instance, the power supply current flows from the terminal 1m1, into the wire F2, mostly through the diode DR3 which is illuminated in red, through the wire F1, then through the diode DV1 and the resistor R2 in the first module 1M, into the wire F3, mostly through the diode DV6 which is illuminated in green, and finally into the fourth wire F4.

Similarly, if the wires F3 and F4 are unintentionally crossed in the second pair P2, the diode DV3 remains lighted, while the diode DV6 is unlighted and the associated diode DR6 lights up, compared to FIG. 9.

It should be noted that, when the second module 2M is used with the switch I3 in the open state to detect crossings between the wires of the pairs, and when the diodes Dv3 and DV6 are lighted, the diode DR2 is lighted according to FIG. 3 and the diode DVI is lighted according to FIG. 9 in the module 1M. The other anomaly configurations in FIGS. 4, 5, 6 and 9, 10 are even more clearly distinguished on the second module 2M.

The modules 1M and 2M described above have minimal configurations for properly testing a bus BU. However, the modules 1M and 2M preferably have electronic components laid out as per FIGS. 11 and 12.

Figure 11:
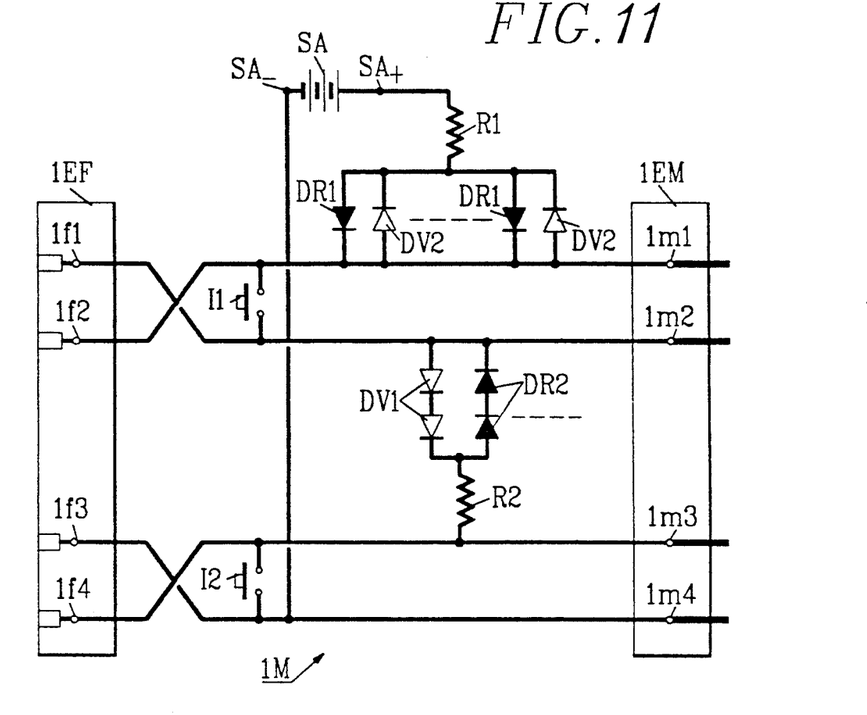
FIG. 11 and 12 respectively show practical embodiments of the first and second modules of the test device.

According to FIG. 11, a first module 1M embodying the invention comprises, between the power supply terminals SA+ and SA−, the following components series-connected from the terminal SA+: a resistor Rl, at least two sets each having two antiparallel diodes DR1 and DV2 of different colors and respectively forward- and reverse-biased from the terminal SA+ to the terminal SA−, a switch I1, at least one set of two series-connected diodes Dv1 connected in antiparallel with at least one set of two series-connected diodes DR2, the diodes DV1 and DR2 having different colors and being respectively forward- and reverse-biased from the terminal SA+ to the terminal SA−, a resistor R2, and a switch I2. As in FIG. 1, the terminals 1m1 and 1m2 and the terminals 1m3 and 1m4 of a first termination 1EM of the module 1M respectively constitute the terminals of the switches I1 and I2. In the case of the normal configuration of the bus BU to be tested by the module IM, according to the combination of FIGS. 1 and 11, each of the two parallel diodes DR1 is flowed through by a current which is half of that flowing through the series diodes DV1. In this instance the module 1M is illuminated in "greeny-yellow", thereby enabling this configuration to be distinguished more clearly by comparison with illuminations in green or red of the module 1M.

The module 1M also has a second termination 1EF having four terminals 1f1, 1f2, 1f3 and 1f4 respectively connected electrically to the terminals 1m2, 1m1. 1m4 and 1m3, subsequent to a crossing of conductors by pairs in the module 1M.

Figure 12:
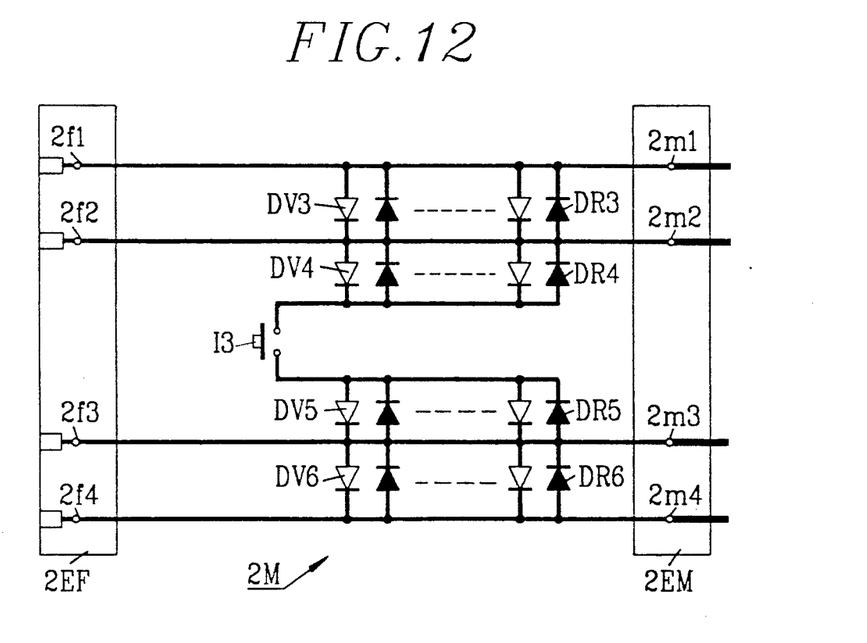

In FIG. 12, the second module 2M has two terminations 2SF and 2EM and a switch I3, as per FIG. 7 or 9. However, instead of each set of antiparallel diodes DV3-DR3, DV4-DR4, DVs-DR6 and DV6-DR6, the module 2M ⓒcomprises two or several such sets of antiparallel diodes. The overall number of sets of antiparallel diodes DR1-Dv2 and DV1-DR2 in the first module 1M, and the number of sets of antiparallel diodes DV3-DR3 to DV6-DR6 in the second module 2M depends on the characteristics of the bus, and more particularly on the characteristic impedances of the pairs Pl and P2 and on the terminating impedances RT1 and RT2. These numbers of diodes are also selected as a function of the required intensity of the illuminations in modules 1M and 2M.

For instance, in the module 1M, the first terminal connector 1EM has terminals 1m1 to 1m4 of the plug type, i.e. female pins, and the other termination 1EF has terminals 1f1 to 1f4 of the socket type, i.e. female pins, presuming that the terminations 1B and 2B of the bus are respectively of the socket type and plug type. In the second module 2M. the terminations 2SF and 2SM preferably comprise sockets 2f1 to 2f4 and plugs 2m1 to 2m4 respectively. In practice, the test modules 1M and 2M are in the form of small boxes with the termination on opposite sides, and containing a printed circuit bearing the diodes, resistors and switches and printed connection conductors. The source SA can be a battery source. The female and male terminations of the modules and bus have additional mechanical enlightening means for signalling a 180° turnover of one termination with regard to the other.

According to other embodiments, each of the modules 1M and 2M comprises logic means so as to signal by means of three visual indicators inscriptions corresponding to the absence of anomalies, according to FIGS. 1, 7 and 9 respectively, and by means of other respective visual indicators the anomalies according to FIG. 2 to 6, 8 and 10. In fact, each of the light emitting diodes is equivalent to a local current sensing means, and the activations of these current sensing means can be logically combined to excite the visual indicators. Such a sensing means can be a photoemissive element, such as a LED, coupled to a photoreceptive element, such as a photoresistor or phototransistor, included in an opto-logic circuit containing said visual indicators with inscriptions. According to another embodiment, each current sensing means is a conventional transistor or relay included in a logic circuit containing said visual indicators with inscriptions.

The plugging of one of the terminations of one of the modules 1M and 2M into one of the terminations of the other module enables the charging condition of the batteries to be assessed when the former constitute the voltage source SA, and the proper working order of the signalling means to be tested, i.e. the light emitting diodes in the two modules.

Figure 13:
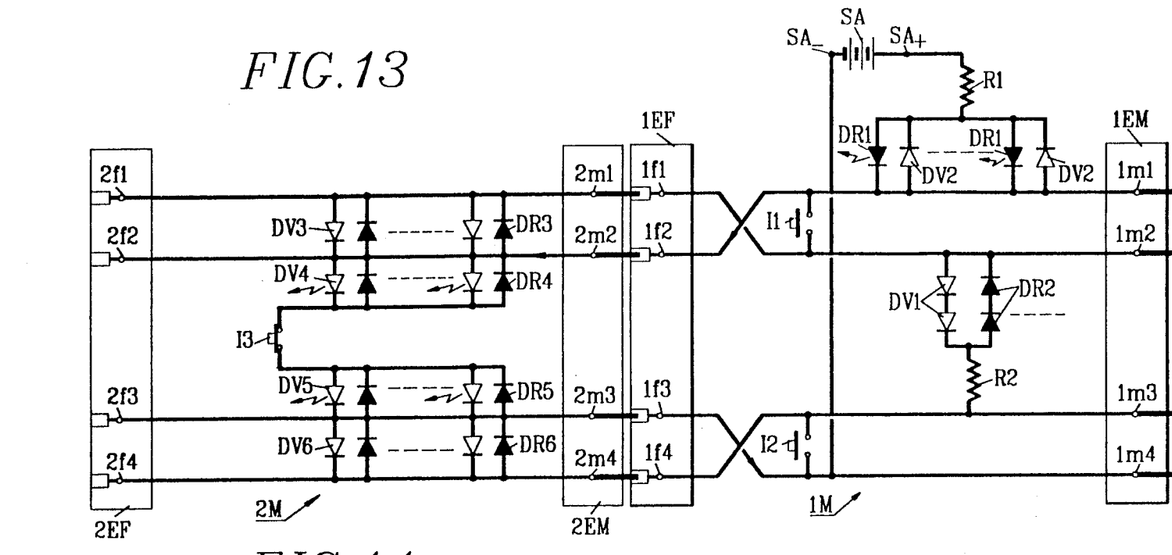
FIG. 13 shows an assembly of the first and second modules, destined to enable the proper working of these modules to be tested.

For instance, in reference to FIG. 13, the termination 2EM of the module 2M is plugged into the termination IEF of the module IM, so as to connect the terminals 2m1 to 2m4 respectively to the terminals 1f1 to 1f4. Due to the connection conductors in the module 1M being crossed between the switches I1 and I2 and the termination lEF, the configuration is similar to that of the abnormal wiring shown in FIG. 10, but with a crossing in each of the pairs of conductors. When the switch I3 in the module IM is closed, as shown in FIG. 13, the power supply current activates the red diode DRI in the first module, and mostly flows through the green diodes DV1 and DvS which are activated in the second module 2M, before finally flowing through the terminals 2m3 and lf3. The first module is therefore red and the second module is green.

When the switch I3 is open, the power supply current flows through the red diode DRI in the first module, the red diodes DR3 in the second module, the diodes DV1 in the first module, and finally the red diodes DR6 in the second module. The first module 1M is then illuminated in yellow, and the second module 2M is illuminated in red. To test the proper operation of the other diodes DV3, DR4, DRS and DV6 in the second module, the second module need only be turned through 180° by comparison with the first module in FIG. 1, so as to respectively connect the terminals 1f1 to 1f4 of the first module to the terminals 2m4 to 2ml of the second module. and so as to open the switch I3.

To test the diodes DV2 and DR2 in the first module 1M, the polarization of the power supply terminals need only be inverted by turning the power supply batteries over. It should be noted that the diodes DV2 are not really of use in testing the bus BU but are included in the module 1M insofar as the latter uses sets of antiparallel diodes to limit the production costs of the modules 1M and 2M, and insofar as they can replace the diodes DRI when the power supply terminals SA+ and SA− are inverted.

The other test of the modules 1M and 2M according to connections similar to those shown in FIG. 13, does of course take before proceeding to the tests for electric continuity and for crossings between two wires of the two pairs P1 and P2 hy means of the module 1M, in reference to FIG. 1, followed by the tests for crossings of the pairs PI and P2 and for permutations of wires in each of the pairs in reference to FIGS. 7 and 9.

Figure 14:
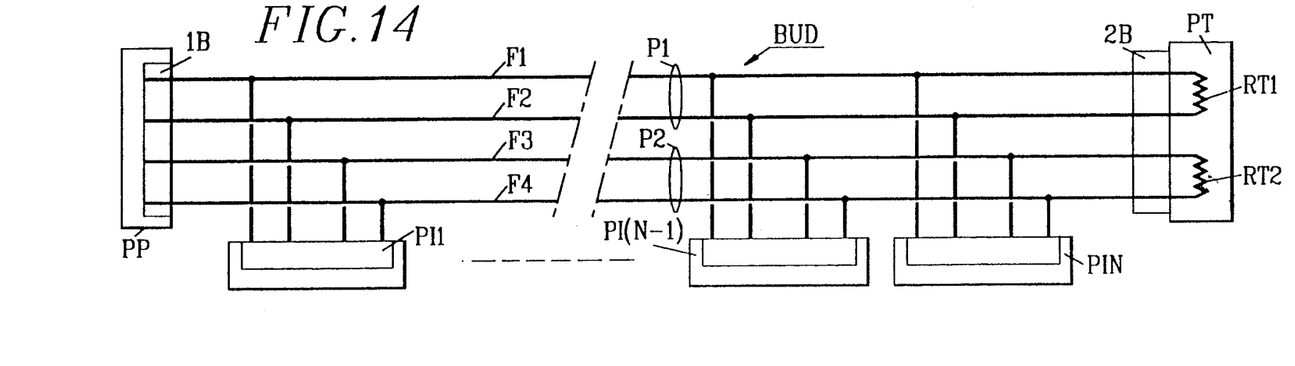
FIG. 14 schematically shows a distributed bus to be tested by the test device embodying the invention.

A test device embodying the invention is not restricted to a simple four-conductor bus as referred to above. In particular, the test device is used to detect anomalies in a bus distributed BUD between a main outlet PP and a terminating outlet PT, to N intermediary terminal outlets PI1 to PIN, as shown in FIG. 14. The bus can be one of the buses of a local area network of the ISDN type in which a first pair Pl of wires Fl and F2 is allocated to a signal transmission direction and in which a second pair P2 of wires F3 and F4 is allocated to the other transmission direction. For instance, the wires Fl and F3 are positively biased and the wires F2 and F4 are negatively biased. The outlet PP is comprised of a termination 1B and the outlet PT is comprised of a termination 2B to which are connected two terminating impedances RT1 and RT2 allocated to the two pairs. The four types of tests that have been described above for the bus BU are also conducted to test the distributed bus BUD. However, when an anomaly between the outlets PP and PT is signalled by this first series of tests, further test are carried out between the outlet PP and the outlets PI1 to PIN respectively in order to locate the anomaly along the distributed bus BUD.

What we claim is:

1. A device for testing a bus, said bus comprising:
   first, second, third and fourth parallel conducting wires;
   a first termination having first, second, third and fourth terminals normally connected to first ends of said first, second, third and fourth conducting wires, respectively;
   a second termination having first, second, third and fourth terminals normally connected to second ends of said first, second, third and fourth conducting wires, respectively;
   first and second terminating impedances respectively connectable to said first and second terminals of said second termination and to said third and fourth terminals of said second termination;
   said test device comprising;
   a DC voltage sources;
   a first switch connectable to said first and second terminals of said first termination;
   a second switch connected in series with said voltage source and said first switch, and connectable to said third and fourth terminals of said first termination;
   a first current sensing means forward-biased by said voltage source and interconnected in series between said voltage source and said switches;
   second and third anti-parallel-connected current sensing means and a resistor connected in series between said second and third terminals of said first termination;
   a fifth and sixth current sensing means connectable in anti-parallel between said second and third terminals of said second termination;
   a third switch connected in series to said fifth and sixth current sensing means between said second and third terminals of said second termination;
   seventh and eighth current sensing means connectable in anti-parallel between said first and second terminals of said second termination; and
   ninth and tenth current sensing means connectable in anti-parallel between said third and fourth terminals of said second termination.

2. The device as claimed in claim 1, wherein said first current sensing means comprises two photoemissive elements connected in parallel, and wherein each of said second and third current sensing means comprises two photoemissive elements connected in series.

3. The device as claimed in claim 1, wherein said voltage source, said first and second switches and said first, second and third current sensing means are housed in a first module that is pluggable into said first termination.

4. The device as claimed in claim 3, wherein said first module comprises a fourth current sensing means connected in antiparallel to said first current sensing means.

5. The device as claimed in claim 1, comprising a second module pluggable into said second termination and interconnectable between said second termination and said two terminating impedances, said second module including said fifth, sixth, seventh, eighth, ninth and tenth current sensing means, and said third switch.

6. The device as claimed in claim 1, comprising:
a fourth current sensing means connected in antiparallel to said first current sensing means;
a first module having first and second terminations and containing said voltage source, said first and second switches, and said first, second, third and fourth current sensing means;
a second module having first and second terminations and interconnectable between said second terminations and said terminating impedances, said second module containing said third switch and said fifth, sixth, seventh, eighth, ninth and tenth current sensing means;
said terminals of said first and second switches being connected to first, second, third and fourth terminals of said first termination of said first module which are respectively connectable to the first, second, third and fourth terminals of said first termination of said bus, and being connected to second, first, fourth and third terminals of said second termination of said first module which are respectively connectable to second, first, fourth and third terminals of one of the two terminations of said second module; and
said first, second, third and fourth terminals of said terminations of said second module constituting terminals of said current sensing means contained in said second module and being connectable to said first, second, third and fourth terminals of said second bus termination.

7. The device as claimed in claim 1, wherein each of said current sensing means comprises at least one photoemissive element.

8. The device as claimed in claim 1, wherein each of said current sensing means comprises at least one light emitting diode, and the diodes in said first and third current sensing means are associated with a color that is different from that of the diode in said second current sensing means.

9. The device as claimed in claim 6, wherein:
each of said current sensing means comprises at least one light emitting diode;
in the first module, the diodes in said first and third current sensing means are associated with a color that is different from that of the diode in said second current sensing means; and
the diodes in said fifth, seventh and ninth current sensing means are of a color that is different from that of the diodes in said sixth, eighth and tenth current sensing means.

* * * * *